(12) United States Patent
Kim et al.

(10) Patent No.: US 9,350,300 B2
(45) Date of Patent: May 24, 2016

(54) POWER AMPLIFIER

(71) Applicant: Avago Technologies General IP (Singapore) Pte. Ltd., Singapore (SG)

(72) Inventors: Un Ha Kim, Seoul (KR); Jung Hyun Kim, Uiwang (KR); Young Kwon, Thousand Oaks, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 139 days.

(21) Appl. No.: 14/165,829

(22) Filed: Jan. 28, 2014

(65) Prior Publication Data

US 2015/0214908 A1    Jul. 30, 2015

(51) Int. Cl.
| | | |
|---|---|---|
| *H03F 3/04* | (2006.01) | |
| *H03F 1/02* | (2006.01) | |
| *H03F 1/32* | (2006.01) | |
| *H03F 1/56* | (2006.01) | |
| *H03F 3/189* | (2006.01) | |

(Continued)

(52) U.S. Cl.
CPC ............ *H03F 1/0266* (2013.01); *H03F 1/3247* (2013.01); *H03F 1/3288* (2013.01); *H03F 1/56* (2013.01); *H03F 3/189* (2013.01); *H03F 3/193* (2013.01); *H03F 3/24* (2013.01); *H03F 3/245* (2013.01); *H03F 2200/102* (2013.01); *H03F 2200/213* (2013.01); *H03F 2200/222* (2013.01); *H03F 2200/318* (2013.01); *H03F 2200/387* (2013.01); *H03F 2200/411* (2013.01); *H03F 2200/453* (2013.01); *H03F 2200/555* (2013.01); *H03F 2201/3212* (2013.01)

(58) Field of Classification Search
CPC ......... H03F 3/211; H03F 1/0288; H03F 1/56; H03F 3/245; H03F 3/45179; H03F 1/0294; H03F 2200/387; H03F 3/19; H03F 3/602; H03F 1/3247; H03F 2200/108; H03F 2200/336; H03F 2200/451; H03F 3/193
USPC ......................................... 330/296, 302, 310
See application file for complete search history.

(56) References Cited

U.S. PATENT DOCUMENTS

| | | | |
|---|---|---|---|
| 6,424,212 B1 | 7/2002 | Brandt | |
| 6,744,321 B2 | 6/2004 | Noh et al. | |
| 6,900,693 B2 * | 5/2005 | Sasho et al. | ................... 330/133 |

(Continued)

FOREIGN PATENT DOCUMENTS

| | | |
|---|---|---|
| WO | WO2006012306 | 2/2006 |
| WO | WO2011021995 | 2/2011 |

(Continued)

OTHER PUBLICATIONS

Noh, et al. "An Intelligent Power Amplifier MMIC Using a New Adaptive Bias Control Circuit for W-CDMA Applications", IEEE Journal of Solid-State Circuits, vol. 39, No. 6, Jun. 2004.

(Continued)

*Primary Examiner* — Khanh V Nguyen

(57) ABSTRACT

A linearized power amplifier includes a first amplification stage having a first transistor for amplifying an input signal and outputting a pre-amplified signal, and a second amplification stage having a second transistor for amplifying the pre-amplified signal. A phase injection circuit, connected to the gate of the first transistor and the gate of the second transistor, adjusts the phase of the input signal based on the pre-amplified signal so as to compensate for AM-AM distortion and AM-PM distortion.

23 Claims, 14 Drawing Sheets

(51) Int. Cl.
*H03F 3/193* (2006.01)
*H03F 3/24* (2006.01)

(56) References Cited

U.S. PATENT DOCUMENTS

| | | |
|---|---|---|
| 7,062,236 B2 | 6/2006 | Midtgaard et al. |
| 8,368,470 B2 | 2/2013 | Alidio et al. |
| 2011/0279179 A1 | 11/2011 | Vice |
| 2013/0241655 A1 | 9/2013 | Liss et al. |
| 2014/0049322 A1 | 2/2014 | Jeon et al. |
| 2015/0091649 A1 | 4/2015 | Jeon et al. |
| 2015/0214908 A1 | 7/2015 | Kim et al. |

FOREIGN PATENT DOCUMENTS

| | | |
|---|---|---|
| WO | WO2011022551 | 2/2011 |
| WO | WO2011025598 | 3/2011 |

OTHER PUBLICATIONS

Yoo, et al. "A Highly Linear CMOS Power Amplifier with AM-AM and AM-PM Compensation for 2.3GHz Wibro/WiMax Applications", Proceedings of Asia-Pacific Microwave Conference 2007.

\* cited by examiner

POWER AMPLIFIER

BACKGROUND

The inventive concepts described herein relate to a power amplifier and, more particularly, to a linearized power amplifier.

In carrying out power amplification, a power amplifier normally utilizes nonlinear elements such as transistors, diodes, and other nonlinear semiconductor devices. As a result, a nonlinear distortion may occur to an output signal of the power amplifier. For instance, as the magnitude of an input signal increases, the ratio between the magnitude of the output signal and that of the input signal, i.e., a gain of the power amplifier, may be varied. This phenomenon is known as amplitude modulation-amplitude modulation distortion (hereinafter referred to as AM-AM distortion). Similarly, as the magnitude of an input signal increases, a phase shift of the output signal may also occur. This phenomenon is known as amplitude modulation-phase modulation distortion (hereinafter referred to as AM-PM distortion). Such distortions may deteriorate the reliability of the output signal, and the efficiency of the power amplifier.

In view of the aforementioned problems, efforts have been made to attenuate the nonlinearity of a power amplifier. One approach is to provide an envelope-based bias circuit. As illustrated in FIG. 10A, the envelope-based bias circuit 500 includes an envelope detector 510 and a replica 520 of a power amplification stage 530. The envelope detector 510 generates an envelope signal from an input signal. The envelope signal is used to control the replica 520 to produce an analog output signal which represents an inverse of an AM-AM distortion of the power amplification stage 530. Then, the envelope-based bias circuit 500 biases the input signal by using the analog output signal to compensate for the AM-AM distortion of the power amplification stage 530. However, the envelope-based bias circuit 500 is incapable of satisfactorily compensating for an AM-PM distortion of the power amplification stage 530.

As an alternative to the envelope-based bias circuit, there has been proposed a closed-loop linearization circuit 550, illustrated in FIG. 10B. The closed-loop linearization circuit 550 includes a difference unit 560, a processor 570, and a linearizer 580. The difference unit 560 subtracts an input signal from an output signal to obtain sideband information of the output signal that is indicative of the nonlinear characteristics of a power amplification stage 590. The sideband information is then delivered to the processor 570. The processor 570 uses the sideband information to adjust one or more elements within the linearizer 580 so that the closed-loop linearization circuit 550 can dynamically respond to the nonlinear characteristics of the power amplification stage 590. In this way, the closed-loop linearization circuit 550 can compensate for the AM-AM distortion as well as the AM-PM distortion of the power amplification stage 590. However, the closed-loop linearization circuit 550 has a complicated structure, and consumes high direct current (DC) power, which results in an inefficient space utilization and power consumption.

SUMMARY

It is therefore an object of the present invention to provide a power amplifier capable of compensating for both the AM-AM distortion and the AM-PM distortion, and which occupies less space and consumes less power.

In accordance with a representative embodiment, there is provided a power amplifier having a first amplification stage including a first transistor configured to amplify an input signal and output a pre-amplified signal; a second amplification stage including a second transistor configured to amplify the pre-amplified signal; and a phase injection circuit, connected to a gate of the first transistor and a gate of the second transistor, configured to adjust the phase of the input signal based on the pre-amplified signal.

In accordance with another representative embodiment, there is provided a power amplifier having a first amplification stage including a first transistor configured to amplify an input signal and output a pre-amplified signal; a second amplification stage including a second transistor configured to amplify the pre-amplified signal; a hybrid bias circuit, connected to a gate of the second transistor, configured to adjust the bias voltage at the gate of the second transistor based on the magnitude of the pre-amplified signal; and a phase injection circuit, connected to a gate of the first transistor and the gate of the second transistor, configured to adjust the phase of the input signal based on the pre-amplified signal.

BRIEF DESCRIPTION OF THE DRAWINGS

The example embodiments will become apparent from the following description of embodiments, given in conjunction with the accompanying drawings, in which.

DETAILED DESCRIPTION

Hereinafter, preferred embodiments of the present invention will be described in detail with reference to the accompanying drawings. The described embodiments are only exemplary and not to be construed to limit the scope of the invention thereto.

Generally, it is understood that as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Figure 1:
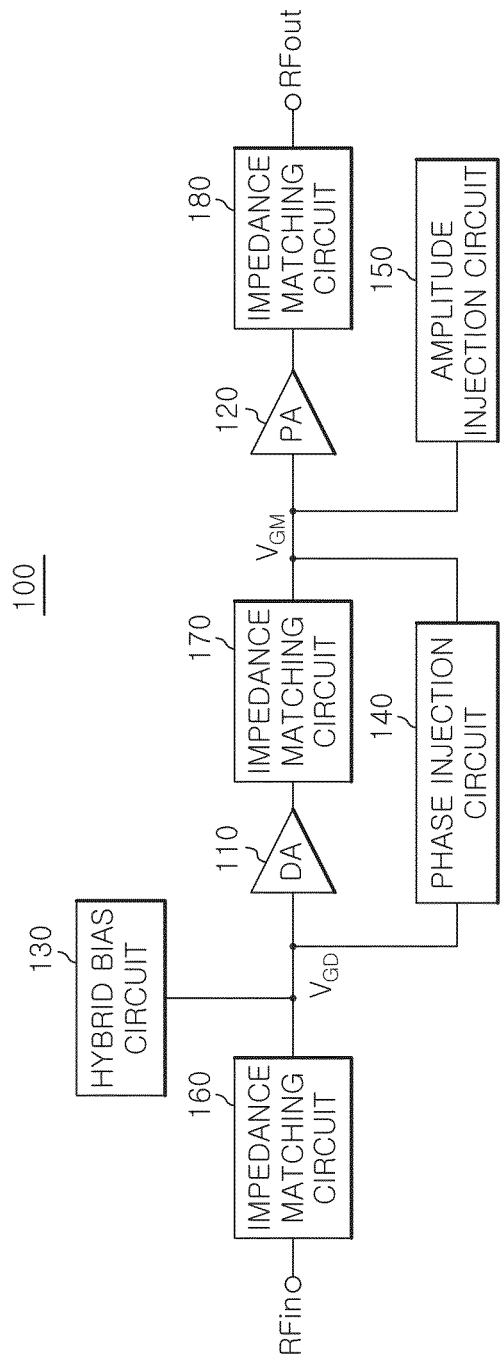
FIG. 1 illustrates a configuration of a power amplifier, according to a representative embodiment.

FIG. 1 illustrates a configuration of a power amplifier, according to a representative embodiment.

Referring to FIG. 1, the power amplifier 100 includes two amplification stages: a first amplification stage 110, and a second amplification stage 120. A hybrid bias circuit 130 is connected to the input terminal of the first amplification stage 110. A phase injection circuit 140 is connected to the input terminal of the first amplification stage 110 and the input terminal of the second amplification stage 120. An amplitude injection circuit 150 is connected to the input terminal of the second amplification stage 120. Impedance matching circuits 160, 170 and 180 are respectively provided at the input terminal of the first amplification stage 110, the input terminal of the second amplification stage 120 and an output terminal of the second amplification stage 120.

An input signal, e.g., a radio frequency signal $RF_{in}$ passes through the impedance matching circuit 160, and is supplied to the input terminal of the first amplification stage 110. The first amplification stage 110 amplifies the RF input signal by a predetermined ratio, and outputs a pre-amplified signal. The pre-amplified signal from the first amplification stage 110 is provided to the input terminal of the second amplification stage 120 to drive the second amplification stage 120. Accordingly, the first amplification stage 110 and its output signal, i.e., the pre-amplified signal, are also referred to respectively as a driver amplifier and a driver signal.

The pre-amplified signal passes through the impedance matching circuit 170, and is input to the input terminal of the second amplification stage 120. The second amplification stage 120 amplifies the pre-amplified signal by a predetermined ratio, and outputs the amplified output signal. The amplified output signal passes through the impedance matching circuit 180 to provide an output signal $RF_{out}$.

The power amplifier 100 according to the representative embodiment utilizes the phase injection circuit 140 in order to achieve improved use of space and power in compensating for nonlinear characteristics of the power amplifier. In order to more reliably compensate for the nonlinearity, the hybrid bias circuit 130 and/or the amplitude injection circuit 150 may also be employed.

The details of the hybrid bias circuit 130 will be described with reference to FIGS. 2 and 3, and the details of the phase injection circuit 140 and the amplitude injection circuit 150 will be described with reference to FIGS. 4 to 6.

Figure 2:
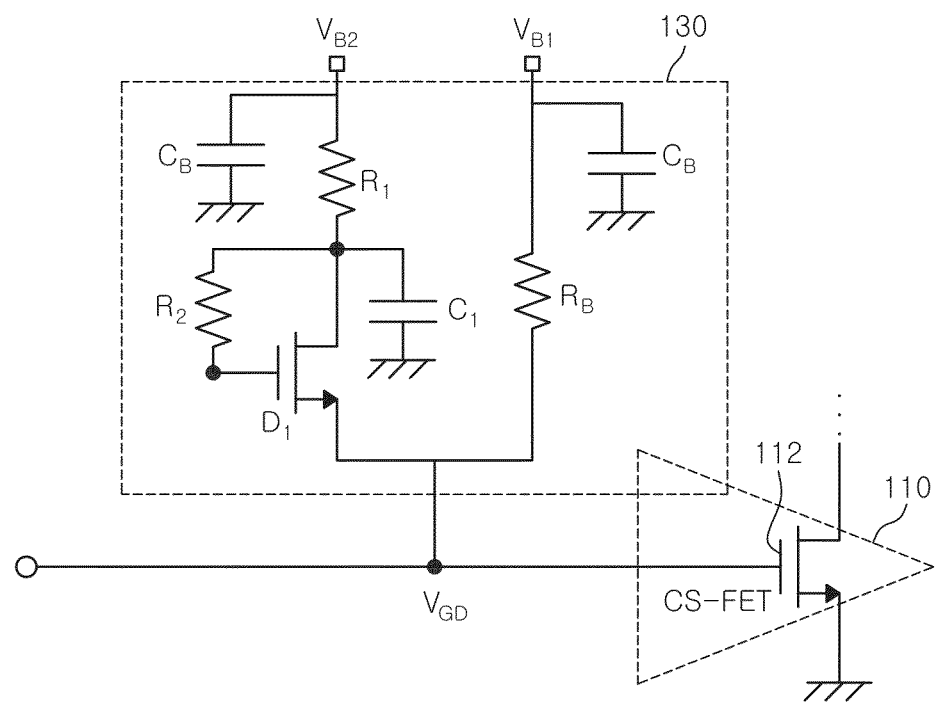
FIG. 2 illustrates a hybrid bias circuit employed in the power amplifier, according to a representative embodiment.
Figure 3:
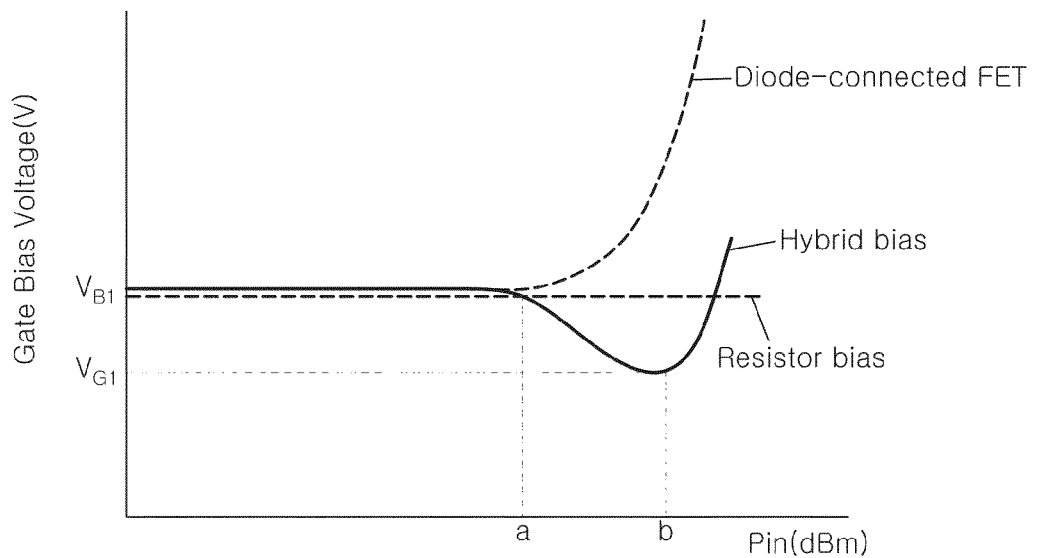
FIG. 3 illustrates a graph showing the magnitude of a gate bias voltage adjusted by the hybrid bias circuit of FIG. 2.

FIG. 2 illustrates a hybrid bias circuit employed in the power amplifier according to a representative embodiment, and FIG. 3 illustrates a graph showing a magnitude of the gate bias voltage adjusted by the hybrid bias circuit of FIG. 2.

As shown in FIG. 2, the hybrid bias circuit 130 is connected to the gate of a first transistor 112 included in the first amplification stage 110. In accordance with a representative embodiment, the first transistor 112 may be a common-source transistor. The hybrid bias circuit 130 according to the representative embodiment includes a bias resistor $R_B$ and a diode-connected field-effect transistor (FET) $D_1$. One end of the bias resistor $R_B$ is connected to a direct current (DC) voltage source supplying voltage $V_{B1}$, and the other end of the bias resistor $R_B$ is connected to the gate of the first transistor 112, as illustrated in FIG. 2. The diode-connected FET $D_1$ has a source connected to the gate of the first transistor 112, a drain connected to a DC voltage source supplying voltage $V_{B2}$ through a resistor $R_1$, and a gate connected to the drain of diode-connected FET $D_1$ through a resistor $R_2$. A pair of capacitors $C_B$ is also included. A first capacitor $C_B$ is connected between the DC voltage source supplying voltage $V_{B1}$ and the ground, and a second capacitor $C_B$ is connected between the DC voltage source supplying voltage $V_{B2}$ and the ground. In this case, voltage $V_{B2}$ may be set to a value that is lower than voltage $V_{B1}$.

The hybrid bias circuit 130 may control the bias voltage at the gate of the first transistor 112 based on the magnitude of the RF input signal. For example, when the magnitude of the RF input signal is equal to or lower than a predetermined value, for example "a" dBm, the diode-connected FET $D_1$ does not operate. As a result, the bias voltage at the gate of the first transistor 112 becomes substantially the same as the voltage $V_{B1}$.

The diode-connected FET $D_1$ starts to operate when the magnitude of the RF input signal exceeds "a" dBm. In this case, when the magnitude of the RF input signal increases to for example "b" dBm, the bias voltage at the gate of the first transistor 112 decreases to a predetermined voltage $V_{G1}$ that is lower than the voltage $V_{B1}$. Furthermore, when the magnitude of the RF input signal increases above "b" dBm, the bias voltage of the gate of the first transistor 112 increases again.

In a conventional power amplifier, the gate of a common source FET is generally biased using either a resistor or a diode-connected bias element. If a diode-connected bias element is used without a resistor, a bias voltage will keep increasing as the magnitude of an RF input signal increases. However, the hybrid bias circuit 130 according to a representative embodiment has a dual bias structure in which the bias resistor $R_B$ is used together with the diode-connected FET $D_1$. Accordingly, for a certain range of the RF input signal, the bias voltage decreases as the magnitude of the RF input signal increases. In general, a lower gate bias voltage is advantageous for the linearization of a power amplifier in a high power band, while a higher gate bias voltage is advantageous in a low-mid power band. In this embodiment, improved linearity may be achieved over a wider operating power range, and a reduction in efficiency at target output power can be prevented.

In addition, the hybrid bias circuit 130 according to a representative embodiment includes a few resistors and capacitors and a single FET, and thus occupies a relatively small space. Furthermore, the hybrid bias circuit 130 consumes significantly lower DC power compared to a conventional bias circuit.

In FIG. 3, the difference between voltage $V_{B1}$ and voltage $V_{G1}$ may vary with the difference between constant voltage $V_{B1}$ and constant voltage $V_{B2}$ of FIG. 2, and may be set to, for example, a value equal to or lower than 100 mV. The resistor $R_B$ may have a resistance higher than a few K ohms, and a capacitor $C_1$ may have a capacitance suitable for adjusting the magnitude of values "a" and "b". In some examples, in order to reduce value "a" of the output, the capacitor $C_1$ may be connected to the diode-connected FET $D_1$.

Figure 4:
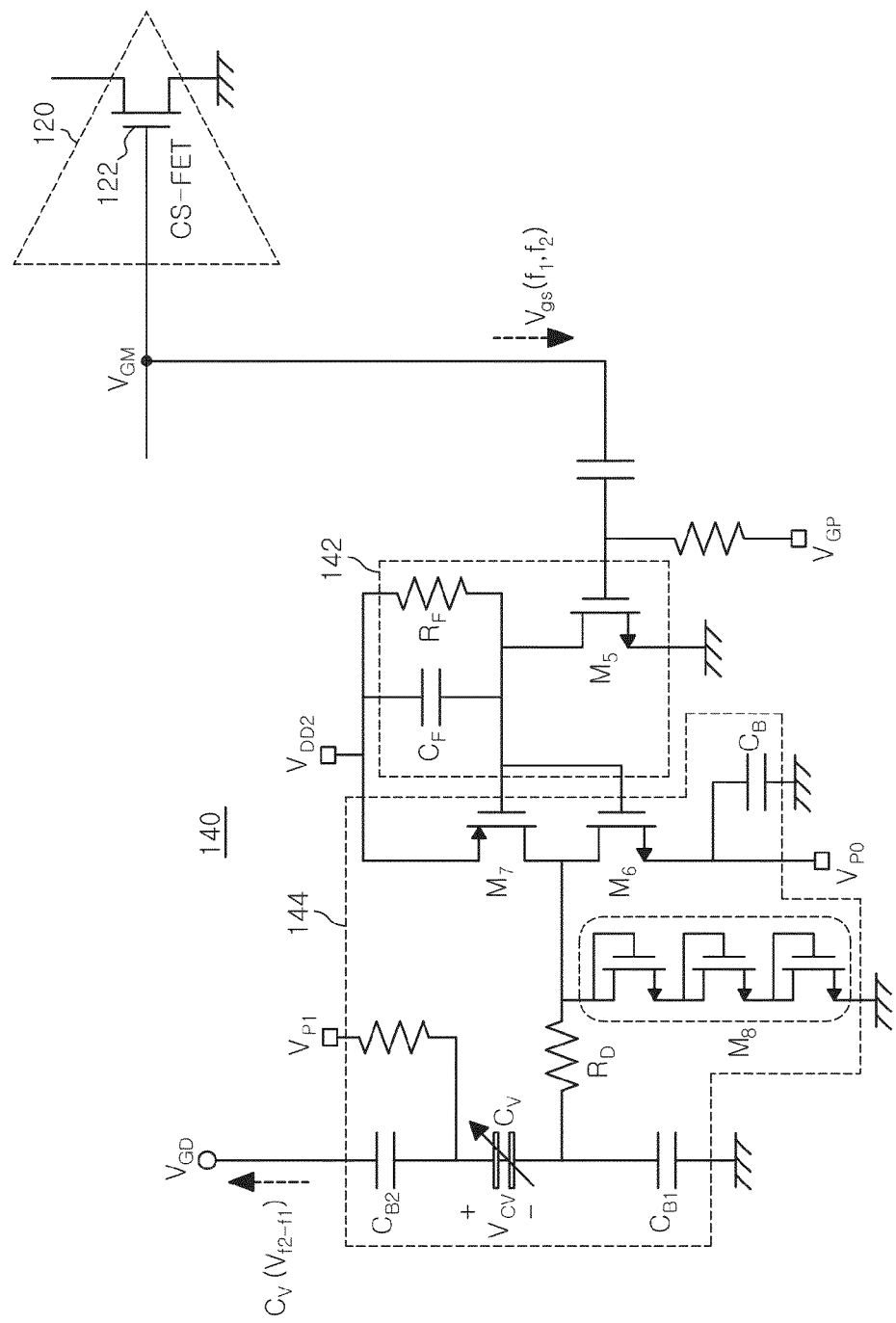
FIG. 4 illustrates a phase injection circuit employed in the power amplifier, according to a representative embodiment.
Figure 5:
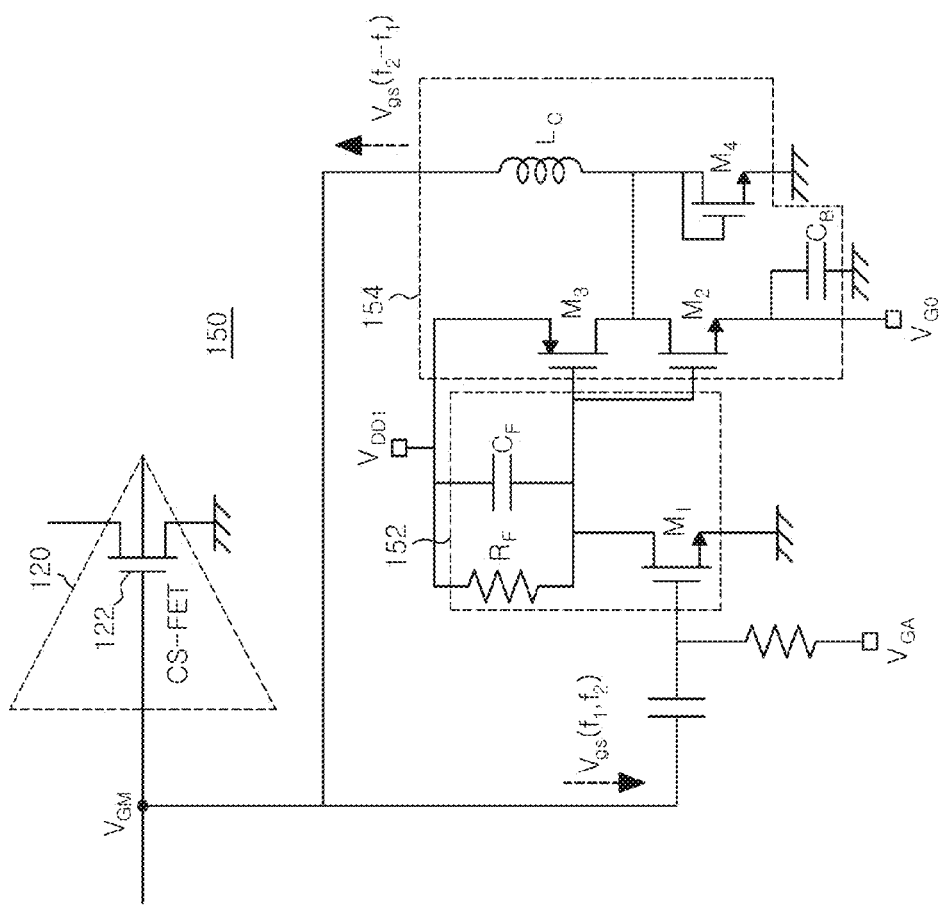
FIG. 5 illustrates an amplitude injection circuit employed in the power amplifier, according to a representative embodiment.

FIG. 4 illustrates a phase injection circuit employed in the power amplifier according to a representative embodiment, and FIG. 5 illustrates an amplitude injection circuit employed in the power amplifier according to a representative embodiment. Furthermore, FIG. 6 illustrates a graph showing changes in the capacitance of a varactor employed in the phase injection circuit of FIG. 4, and changes in the magnitude of a reshaped envelope signal generated by the amplitude injection circuit of FIG. 5.

The phase injection circuit 140 according to a representative embodiment is connected to the gate of the first transistor 112 included in the first amplification stage 110 and the gate of the second transistor 122 included in the second amplification stage 120. In this case, the second transistor 122 may be a common-source transistor. The phase injection circuit 140 may adjust the phase of the RF input signal at the gate of the first transistor 112 based on the pre-amplified signal (more specifically, based on the pre-amplified signal passed through the impedance matching circuit 170). The phase injection circuit 140 includes an envelope detection unit 142 configured to generate an envelope signal from the pre-amplified signal provided by the first amplification stage 110, and a phase control unit 144 configured to predistort the phase of the RF input signal based on the magnitude of the generated envelope signal.

Referring to FIG. 4, the envelope detection unit 142 includes a common source FET $M_5$, a capacitor $C_F$, and a resistor $R_F$. The gate of the common source FET $M_5$ is connected to the gate of the second transistor 122. The capacitor $C_F$ and the resistor $R_F$ are connected in parallel. One end of the capacitor $C_F$ and one end of the resistor $R_F$ are connected to a DC voltage source supplying voltage $V_{DD2}$, and the other end of the capacitor $C_F$ and the other end of the resistor $R_F$ are connected to the drain of the common source FET $M_5$. The phase control unit 144 includes a varactor $C_V$ and two Field-Effect Transistors (FETs) $M_6$ and $M_7$. Shunt capacitors $C_{B1}$ and $C_{B2}$ are respectively connected to the cathode and the anode of the varactor $C_V$, and may block DC components. The cathode of the varactor $C_V$ is connected to the ground via the shunt capacitor $C_{B1}$, and the anode of the varactor $C_V$ is connected to the gate of the first transistor 112 via the shunt capacitor $C_{B2}$. Furthermore, the drains of the FET $M_6$ and the FET $M_7$ are connected to the cathode of the varactor $C_V$ through a resistor $R_D$. Furthermore, the drain of the common source FET $M_5$ is connected to the gate of the FET $M_6$ and the gate of the FET $M_7$.

The envelope voltage at the gate of the second transistor 122 is detected by the envelope detection unit 142. The capacitor $C_F$ and resistor $R_F$ of the envelope detection unit 142 filter the pre-amplified signal (i.e., an input signal at the gate of the second transistor 122), and the common source FET $M_5$ generates an envelope signal in an out-of-phase state based on the filtered pre-amplified signal. The FETs $M_6$ and $M_7$ may generate a reshaped envelope signal by modifying the envelope signal. The reshaped envelope signal is output from the drains of the FETs $M_6$ and M; to the cathode of the varactor $C_V$ through the resistor $R_D$.

Figure 6:
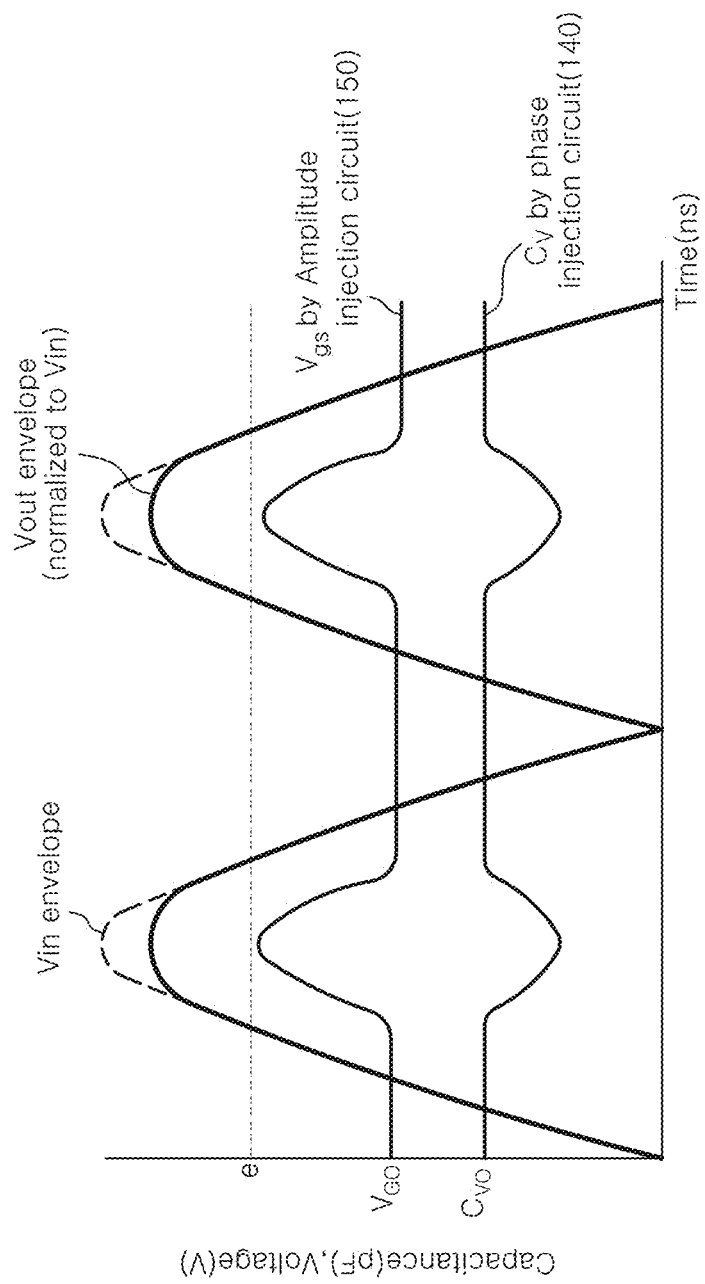
FIG. 6 illustrates a graph showing changes in the capacitance of a varactor employed in the phase injection circuit of FIG. 4, and changes in the magnitude of a reshaped envelope signal generated by the amplitude injection circuit of FIG. 5.

If the magnitude of the envelope signal is equal to or lower than a predetermined level, for example, "e" Voltage shown in FIG. 6, the reshaped envelope signal is not transferred to the cathode of the varactor $C_V$. Thus, the varactor $C_V$ is positively biased. That is, voltage $V_{CV}$ across the varactor $C_V$ is maintained at the value of the difference between DC voltage $V_{P1}$ and DC voltage $V_{P0}$ shown in FIG. 4. In this case, the capacitance of the varactor $C_V$ is maintained at a predetermined value, for example, capacitance $C_{V0}$ indicated in FIG. 6.

If the magnitude of the envelope signal increases and exceeds a predetermined level, that is, "e" Voltage as shown in FIG. 6 (that is, the magnitude reaches near the maximum linear output power band), the reshaped envelope signal is transferred to the cathode of the varactor $C_V$. As a result, voltage $V_{CV}$ across the varactor $C_V$ decreases, and the capacitance of the varactor $C_V$ becomes lower than the predetermined value, e.g., the capacitance $C_{V0}$.

As described above, the phase injection circuit 140 may adjust the capacitance of the varactor $C_V$ based on the magnitude of the envelope signal, thereby predistorting the phase of the RF input signal. In this way, the AM-PM distortion of the power amplifier may be compensated for. Furthermore, the AM-AM distortion may also be adjusted by the phase injection circuit 140 to a certain extent.

The phase control unit 144 may further include a capacitor $C_B$ connected to the source of the FET $M_6$ and the ground, and a limiter $M_8$ connected to the drain of the FET $M_6$ and the drain of the FET $M_7$. The limiter $M_8$ may limit the maximum negative power swing of the voltage $V_{CV}$ across the varactor $C_V$. In order to optimize capacitance injection at target output power, the reference capacitance of the varactor $C_V$ and constant voltages $V_{P0}$ and $V_{P1}$ may be set to appropriate values. If the difference between constant voltages $V_{P0}$ and $V_{P1}$ decreases, a power level causing the phase injection circuit 140 to start operating will be lowered.

The amplitude injection circuit 150 is connected to the gate of the second transistor 122. The amplitude injection circuit 150 may generate an envelope signal from the pre-amplified signal supplied by the first amplification stage 110, and may adjust the amplitude of the envelope signal based on the magnitude of the pre-amplified signal, thereby generating a reshaped envelope signal. The generated reshaped envelope signal is output to the gate of the second transistor 122 again.

Referring to FIG. 5, the amplitude injection circuit 150 includes an envelope detection unit 152, and an amplitude control unit 154. The envelope detection unit 152 includes a common source FET $M_1$, a capacitor $C_F$, and a resistor $R_F$, which has a similar configuration of the envelope detection unit 142 included in the phase injection circuit 140. Furthermore, the gate of the common source FET $M_1$ is connected to the gate of the second transistor 122. The capacitor $C_F$ and the resistor $R_F$ are connected in parallel. One end of the capacitor $C_F$ and one end of the resistor $R_F$ are connected to a DC voltage source of a voltage $V_{DD1}$, and the other end of the capacitor $C_F$ and the other end of the resistor $R_F$ are connected to the drain of the common source FET $M_1$. The amplitude control unit 154 includes two FETs $M_2$ and $M_3$, the drains thereof being connected to each other, and the gates thereof being connected to each other. The amplitude control unit 154 further includes a diode-connected FET $M_4$, and an inductor $L_C$.

The envelope voltage at the gate of the second transistor 122 is detected by the envelope detection unit 152. The capacitor $C_F$ and the resistor $R_F$ of the envelope detection unit 152 filter the pre-amplified signal (i.e., an input signal at the gate of the second transistor 122), and the common source FET $M_1$ generates an envelope signal in an out-of-phase state based on the filtered pre-amplified signal. The FET $M_2$ and the FET $M_3$ may reshape the envelope signal, thereby generating a reshaped envelope signal. The reshaped envelope signal may be in phase with the envelope signal, and is transferred to the gate of the second transistor 122 through the inductor $L_C$.

When the magnitude of the pre-amplified signal is equal to or lower than a predetermined level, for example, "e" voltage shown in FIG. 6, constant voltage $V_{G0}$ is supplied through the FET $M_2$ as the gate bias voltage of the second transistor 122. When the magnitude of the pre-amplified signal exceeds a predetermined level, that is, "e" voltage, the reshaped envelope signal having the amplitude higher than $V_{G0}$ is applied to the gate of the second transistor 122.

The diode-connected FET $M_4$ may function as a limiter that prevents the magnitude of the reshaped envelope signal from increasing with the increase of the magnitude of the pre-amplified signal. The amplitude injection circuit 150 may provide short-circuited impedance at the frequency of the envelope signal to the gate of the second transistor 122 through the inductor $L_C$ and the FET $M_2$.

The phase injection circuit 140 and the amplitude injection circuit 150 may compensate for the distortion of the envelope signal, and achieve efficient operation near the maximum linear power band. In the state-of-the art mobile communication standard (W-CDMA and LTE standards), complicated digital modulation technology, such as phase-shift keying (PSK) or quadrature amplitude modulation (QAM), is employed. In this technology, information to be transferred is described by the amplitude and phase of a modulated envelope signal. Accordingly, if the amplitude and phase of an envelope signal are distorted, the information may not be successfully transferred, resulting in the occurrence of bit errors in the restored information.

According to the representative embodiments, compensation is made to an envelope signal while a distortion is detected. That is, the compensation is not made while the distortion is not detected. For instance, during a period where the magnitude of the RF input signal is high, the envelope signal may be distorted, and thus linearity represented by adjacent channel leakage ratio (ACLR) and error vector magnitude (EVM) may be degraded. In order to avoid this distortion, the amplitude injection circuit 150 injects the bias voltage into the gate of the second amplification stage 120 during a period in which the distortion is detected, thereby dynamically compensating for AM-AM distortion. Furthermore, the phase injection circuit 140 injects an envelope signal-based voltage into the varactor $C_V$, thereby compensating for AM-PM distortion. Furthermore, the phase injection circuit 140 may also compensate for AM-AM distortion to a certain extent.

Figure 7:
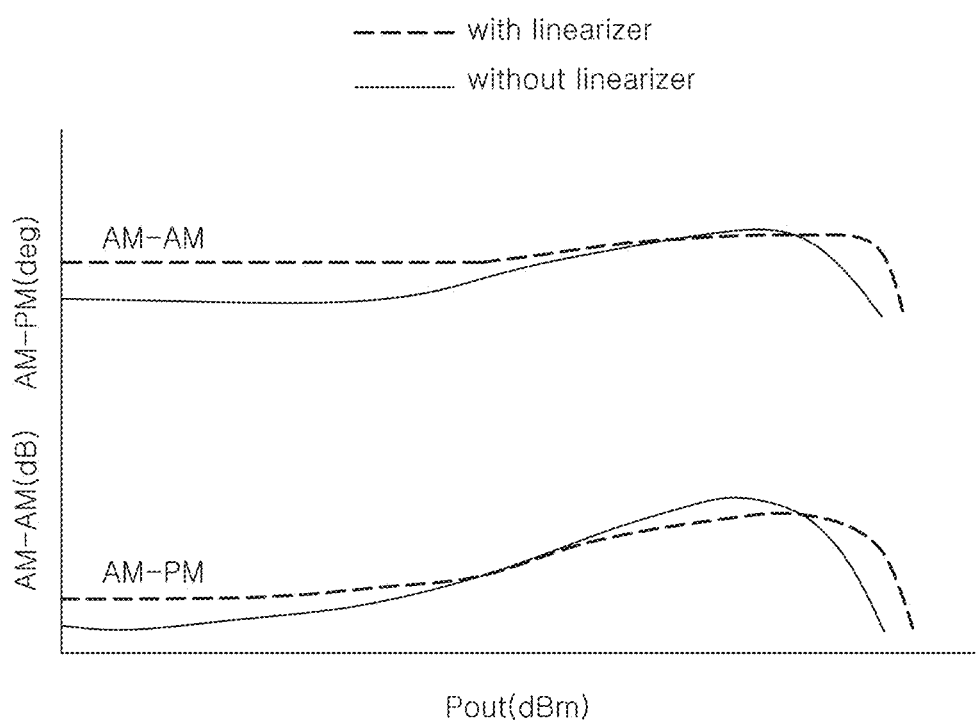
FIG. 7 illustrates a graph showing an improved linearity of the output of the power amplifier of FIG. 1 in comparison with a conventional power amplifier.

FIG. 7 illustrates a graph showing an improved linearity of the output of the power amplifier of FIG. 1 in comparison with a conventional power amplifier.

As illustrated in FIG. 7, the maximum linear operating power range of the power amplifier 100 according to a representative embodiment was increased compared to that of the conventional power amplifier. Furthermore, the AM-AM distortion curve and the AM-PM distortion curve according to a representative embodiment are slower than those obtained from a conventional power amplifier. This is largely attributable to the characteristics of the hybrid bias circuit 130, the phase injection circuit 140, and the amplitude injection circuit 150.

Figure 8:
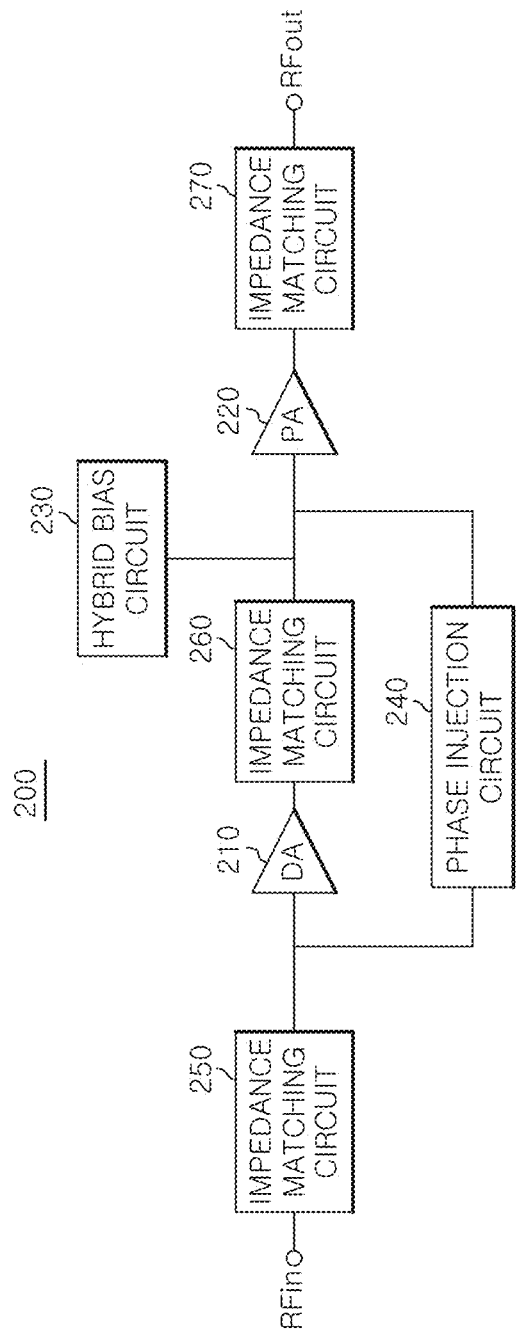
FIG. 8 illustrates a configuration of a power amplifier, according to a representative embodiment.

FIG. 8 illustrates a configuration of a power amplifier, according to a representative embodiment.

The power amplifier 200 as shown in FIG. 8 includes a first amplification stage 210, a second amplification stage 220, a hybrid bias circuit 230, a phase injection circuit 240, and a plurality of impedance matching circuits 250, 260 and 270. The power amplifier 200 is basically similar to the power amplifier 100 shown in FIG. 1. However, in contrast to power amplifier 100, in the power amplifier 200 the hybrid bias circuit 230 is connected to the input terminal of the second amplification stage 210 and an amplitude injection circuit is not included. Descriptions of the configurations of the power amplifier 200 that are the same as those of the power amplifier 100 will be omitted below.

The hybrid bias circuit 230 may adjust the bias voltage of the gate of the second transistor of the second amplification stage 220 (which corresponds to second transistor 122 of the second amplification stage 120 in FIG. 1), based on the magnitude of the output signal of the first amplification stage 210, i.e., a pre-amplified signal. The phase injection circuit 240 is connected to the gates of a first transistor of the first amplification stage 210 (which corresponds to first transistor 112 of the first amplification stage 110 in FIG. 1) and the second transistor of the second amplification stage 220, and may adjust the phase of an RF input signal at the gate of the first transistor of the first amplification stage 210 based on the pre-amplified signal output from the first amplification stage 210.

Figure 9A:
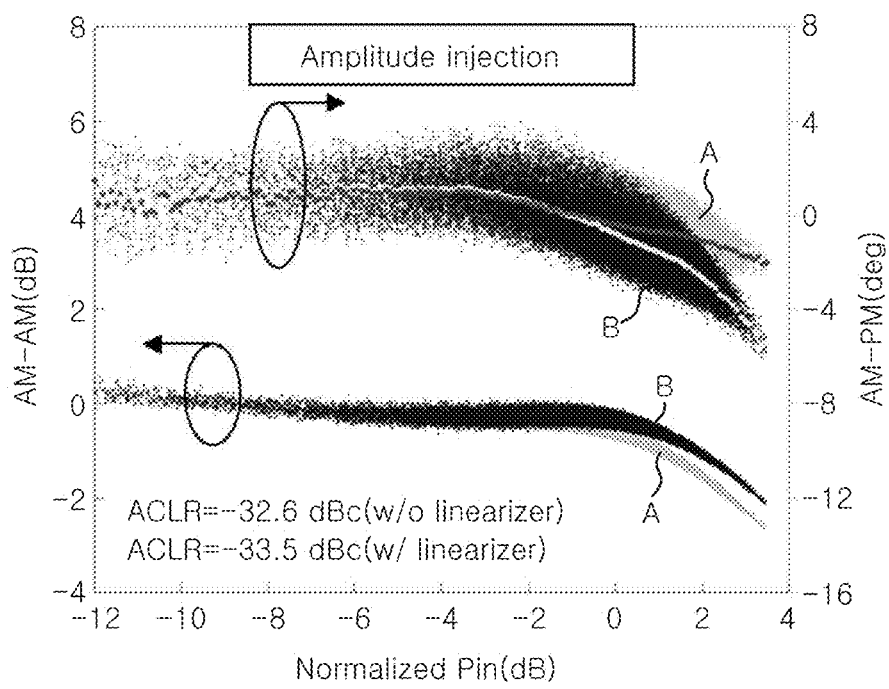
FIGS. 9A, 9B. 9C and 9D illustrate improved AM-AM distortion and AM-PM distortion curves when the hybrid bias circuit of FIG. 2, the phase injection circuit of FIG. 4, and the amplitude injection circuit of FIG. 5 are used.
Figure 9B:
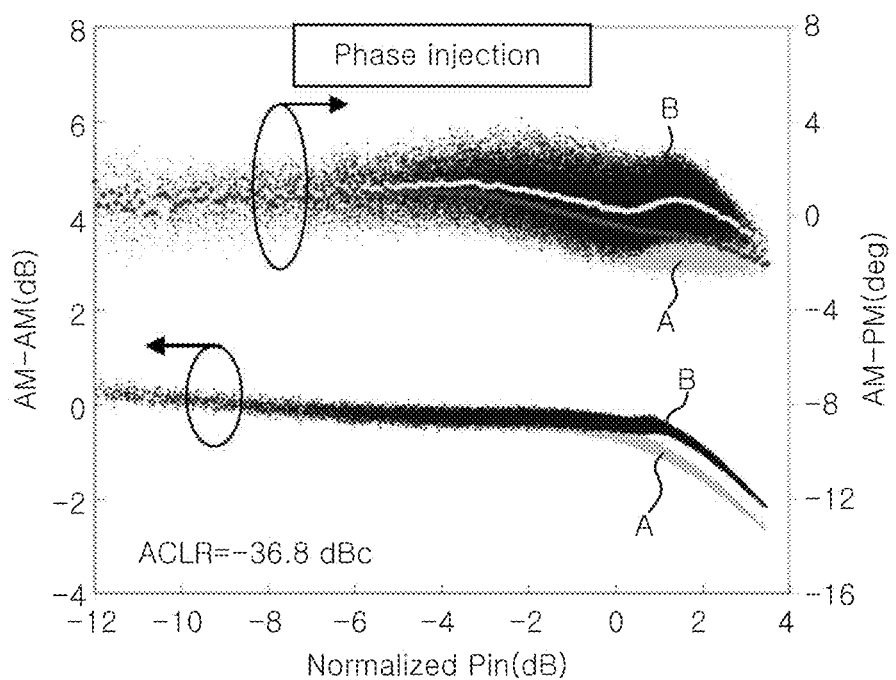
Figure 9C:
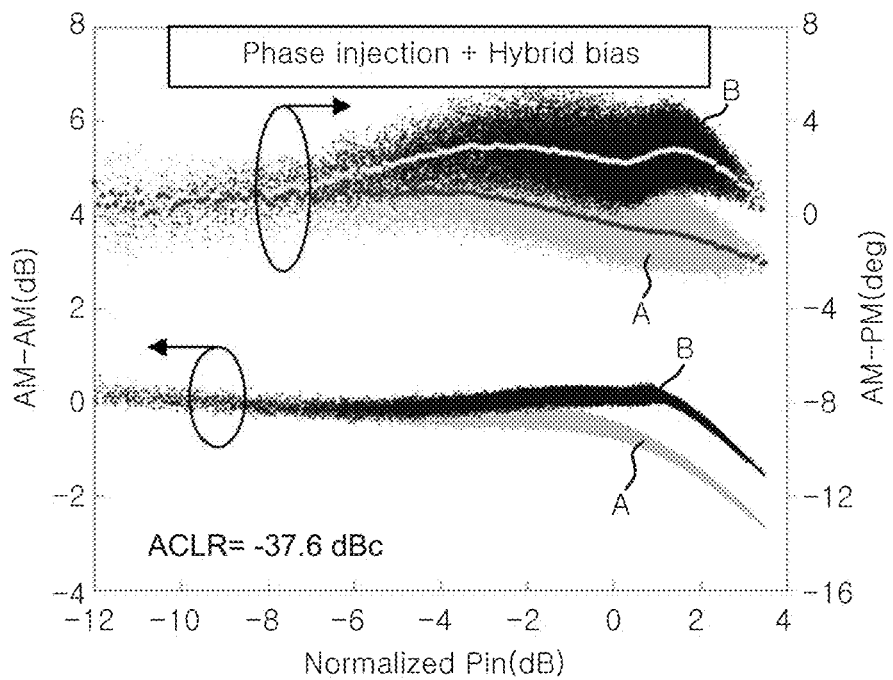
Figure 9D:
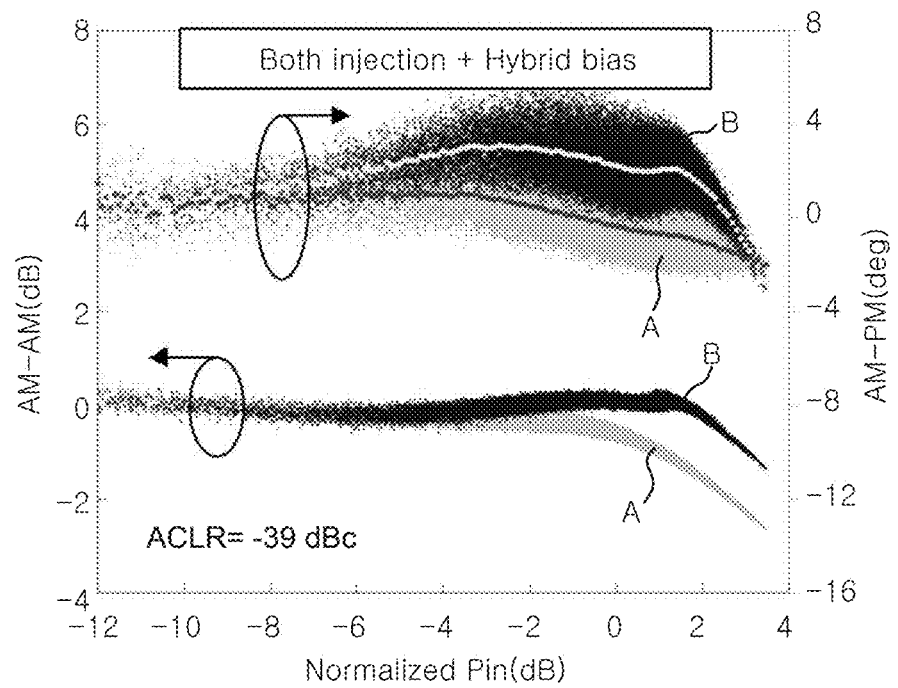
Figure 10A:
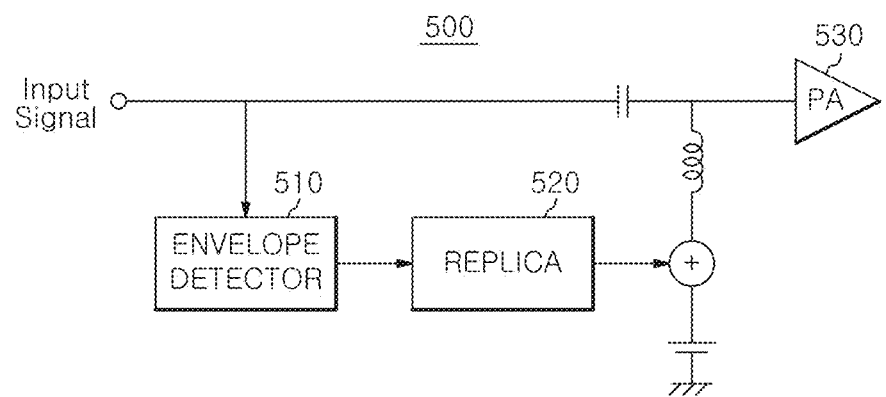
FIGS. 10A and 10B illustrate conventional linearization circuits used in a power amplifier.
Figure 10B:
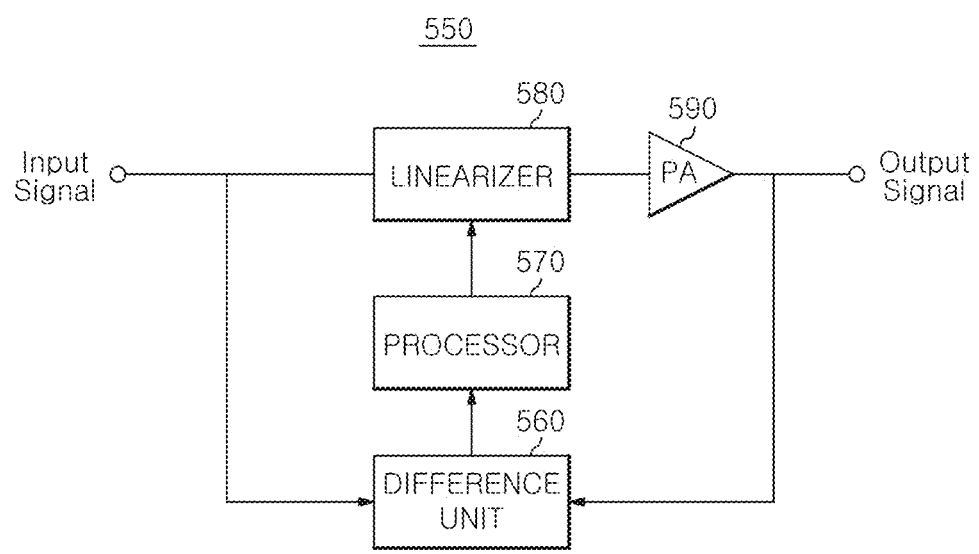

FIGS. 9A, 9B, 9C and 9D illustrate improved AM-AM distortion and AM-PM distortion curves when the hybrid bias circuit of FIG. 2, the phase injection circuit of FIG. 4, and the amplitude injection circuit of FIG. 5 are used. In particular, in FIGS. 9A-9D, A signifies curves when none of the hybrid bias circuit 130, the phase injection circuit 140 and the amplitude injection circuit 150 are used. In FIG. 9A, B signifies curves when the amplitude injection circuit 150 is used. In FIG. 9B, B signifies curves when the phase injection circuit 140 is used. In FIG. 9C, B signifies curves when the hybrid bias circuit 130 and the phase injection circuit 140 are used. In FIG. 9D, B signifies curves when all of the hybrid bias circuit 130, the phase injection circuit 140 and the amplitude injection circuit 150 are used.

The variations of the AM-AM curve and the AM-PM curve against the magnitude of a normalized RF input signal were reduced by using the phase injection circuit 140 as shown in FIG. 9B. That is, it can be seen that although only the phase injection circuit 140 is used, the variation of the AM-PM curve as well as the variation of the AM-AM curve were reduced, which implies an improvement of the linearity. Further, when the hybrid bias circuit 130 is additionally used, the linearity may be more improved as illustrated in FIG. 9C. Furthermore, when the amplitude injection circuit 150 as well as the hybrid bias circuit 130 is additionally used, the linearity may be more improved as illustrated in FIG. 9D. However, when only the amplitude injection circuit 150 is used, the desirable linearity may be obtained as shown in FIG. 9A.

The above-described power amplifier according to representative embodiments is configured such that the phase injection circuit configured to adjust the phase of the RF input signal based on the pre-amplified signal is connected to the gates of the first and second transistors, and thus can efficiently compensate for both AM-AM distortion and AM-PM distortion. Furthermore, the above-described power amplifier further includes the hybrid bias circuit configured to control the bias voltage of the gate of the first transistor based on the magnitude of the RF input signal in order to mitigate the nonlinear characteristics of the power amplifier, and thus can further increase an operating power range.

While certain specific embodiments have been shown and described herein, they are intended to be exemplary only for the purpose of facilitating those skilled in the art to understand the invention, and not to limit the scope of the invention, it will be understood by those skilled in the art that various changes and modifications may be made without departing from the spirit and scope of the invention as defined in the following claims.

What is claimed is:

1. A power amplifier, comprising:
   a first amplification stage including a first transistor configured to amplify an input signal and output a pre-amplified signal;
   a second amplification stage including a second transistor configured to amplify the pre-amplified signal; and a phase injection circuit, connected to a gate of the first transistor and a gate of the second transistor, configured to adjust a phase of the input signal based on the pre-amplified signal, the phase injection circuit comprising: an envelope detection unit configured to generate an envelope signal from the pre-amplified signal; and a phase control unit configured to adjust the phase of the input signal based on a magnitude of the envelope signal.

2. The power amplifier of claim 1, wherein the phase control unit comprises a varactor having a cathode connected to ground via a first shunt capacitor, and an anode connected to the gate of the first transistor via a second shunt capacitor, and wherein the phase control unit is configured to adjust a capacitance of the varactor to a predetermined value if the magnitude of the envelope signal is equal to or smaller than a predetermined level, and to adjust the capacitance of the varactor to a value that is smaller than the predetermined value if the magnitude of the envelope signal is greater than the predetermined level.

3. The power amplifier of claim 2, wherein the phase control unit further comprises a first field-effect transistor (FET) and a second FET, a gate and a drain of the first FET being respectively connected to a gate and a drain of the second FET, and wherein the drain of the first FET and the drain of the second FET are connected to the cathode of the varactor.

4. The power amplifier of claim 3, wherein the envelope detection unit comprises a common-source FET having a gate connected to the gate of the second transistor, and having a drain connected to the gate of the first FET and the gate of the second FET.

5. The power amplifier of claim 1, further comprising a hybrid bias circuit, connected to the gate of the first transistor, configured to adjust a bias voltage at the gate of the first transistor based on a magnitude of the input signal.

6. The power amplifier of claim 5, wherein the hybrid bias circuit comprises:
a bias resistor connected to a first direct current (DC) voltage source supplying a first voltage and to the gate of the first transistor; and
a diode-connected FET having a source connected to the gate of the first transistor, a drain connected to a second DC voltage source supplying a second voltage which is lower than the first voltage, and a gate connected to the drain of the diode-connected FET.

7. The power amplifier of claim 6, wherein when the magnitude of the input signal is equal to or smaller than a preset level, the bias voltage at the gate of the first transistor becomes substantially equal to the first voltage, and when the magnitude of the input signal increases above the preset level, the bias voltage at the gate of the first transistor decreases to a voltage lower than the first voltage.

8. The power amplifier of claim 1, further comprising an amplitude injection circuit connected to the gate of the second transistor, wherein the amplitude injection circuit is configured to produce an envelope signal from the pre-amplified signal, and to adjust an amplitude of the envelope signal based on a magnitude of the pre-amplified signal, to thereby generate and output a reshaped envelope signal to the gate of the second transistor.

9. The power amplifier of claim 8, wherein the amplitude injection circuit is configured to adjust an amplitude of the reshaped envelope signal to a predetermined level if the magnitude of the pre-amplified signal is equal to or smaller than a preset level, and to adjust the amplitude of the reshaped envelope signal to a level higher than the predetermined level if the magnitude of the pre-amplified signal is greater than the preset level.

10. The power amplifier of claim 1, wherein the first transistor is a common-source transistor.

11. The power amplifier of claim 1, wherein the second transistor is a common-source transistor.

12. A power amplifier, comprising:
a first amplification stage including a first transistor configured to amplify an input signal and output a pre-amplified signal;
a second amplification stage including a second transistor configured to amplify the pre-amplified signal;
a hybrid bias circuit, connected to a gate of the second transistor, configured to adjust a bias voltage at the gate of the second transistor based on a magnitude of the pre-amplified signal; and
a phase injection circuit, connected to a gate of the first transistor and the gate of the second transistor, configured to adjust a phase of the input signal based on the pre-amplified signal, the phase detection circuit comprising: an envelope detection unit configured to generate an envelope signal from the pre-amplified signal; and a phase control unit configured to adjust the phase of the input signal based on a magnitude of the envelope signal.

13. The power amplifier of claim 12 wherein the phase control unit comprises a varactor having a cathode connected to ground via a first shunt capacitor, and an anode connected to the gate of the first transistor via a second shunt capacitor, and wherein the phase control unit is configured to adjust a capacitance of the varactor to a predetermined value if the magnitude of the envelope signal is equal to or smaller than a predetermined level, and to adjust the capacitance of the varactor to a value that is smaller than the predetermined value if the magnitude of the envelope signal is greater than the predetermined level.

14. The power amplifier of claim 13, wherein the phase control unit further comprises a first FET and a second FET, a gate and a drain of the first FET being respectively connected to a gate and a drain of the second FET, and wherein the drain of the first FET and the drain of the second FET are connected to the cathode of the varactor.

15. The power amplifier of claim 14, wherein the envelope detection unit comprises a common-source FET having a gate connected to the gate of the second transistor, and having a drain connected to the gate of the first FET and the gate of the second FET.

16. The power amplifier of claim 12, wherein the hybrid bias circuit comprises:
a bias resistor connected to a first DC voltage source supplying a first voltage and to the gate of the second transistor; and
a diode-connected FET having a source connected to the gate of the second transistor, a drain connected to a second DC voltage source supplying a second voltage which is lower than the first voltage, and a gate connected to the drain of the diode-connected FET.

17. The power amplifier of claim 16, wherein when the magnitude of the pre-amplified signal is equal to or smaller than a preset level, the bias voltage at the gate of the second transistor becomes substantially equal to the first voltage, and when the magnitude of the pre-amplified signal increases above the preset level, the bias voltage at the gate of the second transistor decreases to a voltage lower than the first voltage.

18. A power amplifier, comprising:
a first amplification stage including a first transistor configured to amplify an input signal and output a pre-amplified signal;
a second amplification stage including a second transistor configured to amplify the pre-amplified signal;
a phase injection circuit, connected to a gate of the first transistor and a gate of the second transistor, configured to adjust a phase of the input signal based on the pre-amplified signal; and
a hybrid bias circuit, connected to the gate of the first transistor, configured to adjust a bias voltage at the gate of the first transistor based on a magnitude of the input signal, the hybrid bias circuit comprising: a bias resistor connected to a first direct current (DC) voltage source supplying a first voltage and to the gate of the first transistor; and a diode-connected FET having a source connected to the gate of the first transistor, a drain connected to a second DC voltage source supplying a second voltage which is lower than the first voltage, and a gate connected to the drain of the diode-connected FET.

19. The power amplifier of claim 18, wherein when the magnitude of the input signal is equal to or smaller than a preset level, the bias voltage at the gate of the first transistor becomes substantially equal to the first voltage, and when the magnitude of the input signal increases above the preset level, the bias voltage at the gate of the first transistor decreases to a voltage lower than the first voltage.

20. The power amplifier of claim 18, further comprising an amplitude injection circuit connected to the gate of the second transistor,
wherein the amplitude injection circuit is configured to produce an envelope signal from the pre-amplified signal, and to adjust an amplitude of the envelope signal based on a magnitude of the pre-amplified signal, to thereby generate and output a reshaped envelope signal to the gate of the second transistor.

21. The power amplifier of claim 20, wherein the amplitude injection circuit is configured to adjust an amplitude of the reshaped envelope signal to a predetermined level if the magnitude of the pre-amplified signal is equal to or smaller than a preset level, and to adjust the amplitude of the reshaped envelope signal to a level higher than the predetermined level if the magnitude of the pre-amplified signal is greater than the preset level.

22. The power amplifier of claim 18, wherein the first transistor is a common-source transistor.

23. The power amplifier of claim 18, wherein the second transistor is a common-source transistor.

* * * * *